United States Patent
Yamada

(10) Patent No.: US 9,660,208 B2
(45) Date of Patent: May 23, 2017

(54) TRANSPARENT GAS BARRIER FILM, METHOD FOR PRODUCING TRANSPARENT GAS BARRIER FILM, ORGANIC EL ELEMENT, SOLAR BATTERY, AND THIN FILM BATTERY

(71) Applicant: Nitto Denko Corporation, Ibaraki-shi, Osaka (JP)

(72) Inventor: Yasumi Yamada, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 9 days.

(21) Appl. No.: 14/364,945

(22) PCT Filed: Dec. 14, 2012

(86) PCT No.: PCT/JP2012/082474
§ 371 (c)(1),
(2) Date: Jun. 12, 2014

(87) PCT Pub. No.: WO2013/099654
PCT Pub. Date: Jul. 4, 2013

(65) Prior Publication Data
US 2014/0308580 A1   Oct. 16, 2014

(30) Foreign Application Priority Data

Dec. 27, 2011  (JP) .................................. 2011-286943
Mar. 1, 2012  (JP) .................................. 2012-045293

(51) Int. Cl.
*C23C 14/54*   (2006.01)
*H01L 51/50*   (2006.01)
(Continued)

(52) U.S. Cl.
CPC ............. *H01L 51/5012* (2013.01); *B32B 9/00* (2013.01); *B32B 27/06* (2013.01); *C23C 14/325* (2013.01);
(Continued)

(58) Field of Classification Search
CPC ............... H01L 51/5253; H01L 51/448; H01L 51/5256; H01L 2251/5346; H01L 51/5012;
(Continued)

(56) References Cited

U.S. PATENT DOCUMENTS

2004/0046497 A1   3/2004  Schaepkens et al.
2005/0037240 A1   2/2005  Haoto et al.
(Continued)

FOREIGN PATENT DOCUMENTS

CN   1695257 A    11/2005
CN   102029738 A   4/2011
(Continued)

OTHER PUBLICATIONS

Office Action dated Jun. 27, 2014, issued in corresponding Taiwanese Patent Application No. 101147174, with Partial English Translation (5 pages).
(Continued)

*Primary Examiner* — Lucas J. O'Donnell
(74) *Attorney, Agent, or Firm* — Westerman, Hattori, Daniels & Adrian, LLP

(57) ABSTRACT

A transparent gas barrier film that has excellent gas barrier properties and includes a transparent gas barrier layer having a very low internal stress, and a method for producing the same. The transparent gas barrier film according to the present invention includes: a resin substrate; and a transparent gas barrier layer formed over the resin substrate. The transparent gas barrier layer includes at least one kind
(Continued)

selected from the group consisting of metals and metalloids. The transparent gas barrier layer includes a plurality of layers each having a density that changes continuously from high density to low density or from low density to high density and then cycles alternatively from low density to high density or high density to low density, respectively, once or two or more times.

8 Claims, 7 Drawing Sheets

(51) Int. Cl.
    *B32B 9/00* (2006.01)
    *H01L 51/44* (2006.01)
    *H01L 51/52* (2006.01)
    *H01L 31/048* (2014.01)
    *H01M 2/02* (2006.01)
    *H01L 31/049* (2014.01)
    *B32B 27/06* (2006.01)
    *C23C 14/32* (2006.01)

(52) U.S. Cl.
    CPC .......... *C23C 14/548* (2013.01); *H01L 31/048* (2013.01); *H01L 31/049* (2014.12); *H01L 51/448* (2013.01); *H01L 51/5256* (2013.01); *H01M 2/0267* (2013.01); *H01M 2/0287* (2013.01); *B32B 2307/412* (2013.01); *B32B 2457/00* (2013.01); *H01L 2251/5346* (2013.01); *H01M 2002/0297* (2013.01); *Y02E 10/549* (2013.01); *Y10T 428/24975* (2015.01); *Y10T 428/24992* (2015.01); *Y10T 428/31678* (2015.04)

(58) Field of Classification Search
    CPC ............. H01L 51/5234; H01L 51/5237; C23C 16/345; C23C 14/562; C23C 16/308; C23C 16/402; C23C 14/024; B32B 2307/412; B32B 2457/00; B32B 27/00; H05B 33/28
    See application file for complete search history.

(56) References Cited

U.S. PATENT DOCUMENTS

| | | | |
|---|---|---|---|
| 2007/0281174 A1* | 12/2007 | Moro | C23C 14/024 428/447 |
| 2008/0085418 A1 | 4/2008 | Fukuda et al. | |
| 2009/0324844 A1 | 12/2009 | Haoto et al. | |
| 2010/0003483 A1 | 1/2010 | Fukuda | |
| 2010/0009147 A1 | 1/2010 | Fukuda | |
| 2011/0073169 A1 | 3/2011 | Iwanaga | |
| 2012/0009368 A1 | 1/2012 | Nakayama | |
| 2012/0021128 A1 | 1/2012 | Dickey | |
| 2012/0040107 A1 | 2/2012 | Hasegawa et al. | |
| 2013/0064977 A1 | 3/2013 | Vermeer et al. | |
| 2015/0333289 A1* | 11/2015 | Yamada | B32B 5/145 257/40 |

FOREIGN PATENT DOCUMENTS

| | | |
|---|---|---|
| CN | 102365387 A | 2/2012 |
| JP | 08-164595 A | 6/1996 |
| JP | 2996516 B2 | 1/2000 |
| JP | 2004-151528 A | 5/2004 |
| JP | 2004-314626 A | 11/2004 |
| JP | 2005-171304 A | 6/2005 |
| JP | 2007-230115 A | 9/2007 |
| JP | 2009-023284 A | 2/2009 |
| JP | 2010-158832 A | 7/2010 |
| JP | 2011-051194 A | 3/2011 |
| JP | 2012-87359 A | 5/2012 |
| WO | 97/37844 A1 | 10/1997 |
| WO | 2006/033233 A1 | 3/2006 |
| WO | 2008/096615 A1 | 8/2008 |
| WO | 2008/096616 A1 | 8/2008 |
| WO | 2010/100971 A1 | 9/2010 |
| WO | 2010/117046 A1 | 10/2010 |
| WO | 2011/027902 A1 | 3/2011 |

OTHER PUBLICATIONS

Office Action dated May 1, 2015, issued in corresponding Japanese Patent Application No. 2011-286943 with English partial translation (8 pages).
International Search Report, dated Apr. 2, 2013, issued in corresponding application No. PCT/JP2012/082474.
Office Action dated Apr. 30, 2015, issued in counterpart Chinese Patent Application No. 201280051657.X, with partial English translation (22 pages).
Office Action dated Jun. 29, 2015 issued in counterpart Japanese application No. 2012-045293 (w/partial translation) (7 pages).
Extended European Search Report dated Jul. 29, 2015 issued in counterpart European Patent Application No. 12861425.2 (6 pages).
Office Action dated Jan. 5, 2016, issued in counterpart Chinese Application No. 201280051657.X, with partial English Translation (28 pages).
International Search Report dated Mar. 11, 2014, issued in corresponding application No. PCT/JP2014/051187.

* cited by examiner

TRANSPARENT GAS BARRIER FILM, METHOD FOR PRODUCING TRANSPARENT GAS BARRIER FILM, ORGANIC EL ELEMENT, SOLAR BATTERY, AND THIN FILM BATTERY

FIELD OF THE INVENTION

The present invention relates to a transparent gas barrier film and a method for producing the same, and to an organic EL element, a solar battery, and a thin film battery.

BACKGROUND OF THE INVENTION

In recent years, various electronic devices such as liquid crystal display elements, organic EL (electroluminescence) elements, electronic paper, solar batteries, and thin film lithium ion batteries are made lighter and thinner. It is known that many of these devices are denatured and deteriorated by water vapor in the air.

Conventionally, in these devices, a glass substrate has been used as a support substrate. However, the use of a resin substrate instead of a glass substrate is now being considered, because the resin substrate is superior in various properties such as lightness, impact resistance, and flexibility. In general, resin substrates exhibit much higher permeability to gases such as water vapor than substrates formed of inorganic materials such as glass. Therefore, in the above-described application purposes, it is required that the gas barrier properties of the resin substrate are improved while maintaining the light permeability of the resin substrate.

It is noted that, electronic devices are required to achieve gas barrier properties extraordinarily higher than those of food packages. Gas barrier properties are represented by a water vapor transmission rate (referred to as "WVTR" hereinafter), for example. The value of WVTR required for conventional food packages is about 1 to 10 $g \cdot m^{-2} \cdot day^{-1}$. In contrast, it is considered that a WVTR of $1 \times 10^{-3}$ $g \cdot m^{-2} \cdot day^{-1}$ or less is required for substrates to be used in thin film silicon solar batteries and compound thin film solar batteries, and a WVTR of $1 \times 10^{-5}$ $g \cdot m^{-2} \cdot day^{-1}$ or less is required for substrates to be used in organic EL elements, for example. In order to address such very high requirements regarding the gas barrier properties, various kinds of methods in which a gas barrier layer is formed over a resin substrate have been proposed (see Patent Documents 1 and 2, for example). However, gas barrier properties of inorganic films formed by vacuum processes typified by these techniques still cannot satisfy the above-described requirements.

On this account, it has been proposed to improve the gas barrier properties by providing a hybrid gas barrier layer in which inorganic layers and polymer layers are laminated alternately (see Patent Documents 3 to 5, for example). However, because different processes are used to form the layers formed of the different materials, this method is not preferable in terms of production efficiency and cost. Furthermore, interlayer adhesion between the inorganic layers and the polymer layers is not high. Thus, there is a problem in that delamination may occur when the laminate is bent, resulting in deterioration in gas barrier properties. Accordingly, it is difficult to apply this method to flexible devices.

CITATION LIST

Patent Document(s)

Patent Document 1: JP H8(1996)-164595 A
Patent Document 2: JP 2004-151528 A
Patent Document 3: Japanese Patent No. 2996516
Patent Document 4: JP 2007-230115 A
Patent Document 5: JP 2009-23284 A

BRIEF SUMMARY OF THE INVENTION

Also, there is a problem in that cracks may occur in a gas barrier layer, although this problem is not pointed out in any of the above-described prior art documents. The problem of cracks affects the gas barrier properties. Thus, with the foregoing in mind, it is an object of the present invention to provide a transparent gas barrier film that has excellent gas barrier properties and includes a transparent gas barrier layer having a very low internal stress, and also a method for producing the same.

Means for Solving Problem

The present invention provides a transparent gas barrier film including: a resin substrate; and a transparent gas barrier layer formed over the resin substrate, wherein the transparent gas barrier layer contains at least one kind selected from the group consisting of metals and metalloids, the transparent gas barrier layer includes a plurality of layers each having a density that changes continuously and periodically in the thickness direction, and the change in density is either change from high density to low density or change from low density to high density.

Another aspect of the present invention is a transparent gas barrier film including: a resin substrate; and a transparent gas barrier layer formed over the resin substrate, wherein the transparent gas barrier layer contains at least one kind selected from the group consisting of metals and metalloids and at least one kind selected from the group consisting of oxygen, nitrogen, and carbon, the transparent gas barrier layer includes a plurality of layers in each of which the atomic ratio (X/M), which is the ratio of the content (X (atom %)) of the at least one element selected from the group consisting of oxygen, nitrogen, and carbon to the content (M (atom %)) of the at least one element selected from the group consisting of metals and metalloids, changes continuously and periodically in the thickness direction, and the change in atomic ratio is either change from high atomic ratio to low atomic ratio or change from low atomic ratio to high atomic ratio.

The present invention also provides a method for producing a transparent gas barrier film that includes a resin substrate and a transparent gas barrier layer formed over the resin substrate. The method includes the step of: forming a transparent gas barrier layer by generating arc discharge plasma and vapor-depositing at least one of a metal oxide and a metalloid oxide on a resin substrate in the presence of a reactant gas, wherein, in the step of forming the transparent gas barrier layer, the vapor deposition is performed while changing the distance between the resin substrate and a plasma source, and the change in distance is at least one of change to extend the distance and change to shorten the distance.

Still another aspect of the present invention is a transparent gas barrier film produced by the production method according to the present invention.

The present invention also provides an organic EL element including: a substrate; and a laminate including an anode layer, an organic EL (electroluminescence) layer, and a cathode layer provided in this order, with the laminate being provided on the substrate, wherein the substrate is the transparent gas barrier film according to the present invention.

The present invention also provides an organic EL element including: a substrate; and a laminate including an anode layer, an organic EL layer, and a cathode layer provided in this order, with the laminate being provided on the substrate, wherein the organic EL element further includes a rear surface sealing member, the laminate is at least partially covered with the rear surface sealing member, and at least one of the substrate and the rear surface sealing member is the transparent gas barrier film according to the present invention.

The present invention also provides a solar battery including: a solar battery cell, wherein the solar battery cell is covered with the transparent gas barrier film according to the present invention.

The present invention also provides a thin film battery including: a laminate including a current collecting layer, an anode layer, a solid electrolyte layer, a cathode layer, and another current collecting layer provided in this order, wherein the laminate is covered with the transparent gas barrier film according to the present invention.

According to the present invention, it is possible to provide a transparent gas barrier film that has excellent gas barrier properties and includes a transparent gas barrier layer having a very low internal stress, and also a method for producing the same.

DETAILED DESCRIPTION OF THE INVENTION

Figure 1:
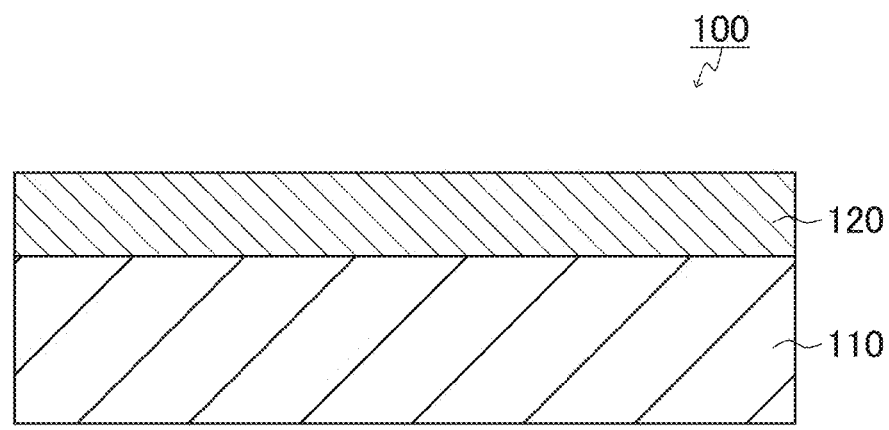
FIG. 1 is a schematic sectional view showing an example of the structure of the transparent gas barrier film according to the present invention.

In the transparent gas barrier film according to the present invention, it is preferable that the ratio ($D_{max}/D_{min}$) of a maximum density value ($D_{max}$) to a minimum density value ($D_{min}$) in the transparent gas barrier layer is 1.1 or more.

In the transparent gas barrier film according to the present invention, it is preferable that the layers each having a density that changes in the thickness direction each have a thickness in the range from 50 to 200 nm.

In the transparent gas barrier film according to the present invention, it is preferable that the layers in each of which the atomic ratio changes in the thickness direction each have a thickness in the range from 20 to 200 nm.

In the transparent gas barrier film according to the present invention, it is preferable that the at least one kind selected from the group consisting of metals and metalloids is at least one kind selected from the group consisting of oxides, nitrides, carbides, oxynitrides, oxycarbides, carbonitrides, and oxycarbonitrides.

In the method for producing the transparent gas barrier film according to the present invention, it is preferable that the step of forming the transparent gas barrier layer is performed while changing the distance repeatedly.

Next, the present invention will be described in detail. It is to be noted, however, that the following description does not limit the present invention by any means.

The transparent gas barrier layer in the transparent gas barrier film according to the present invention includes a plurality of layers each having a density that changes continuously and periodically in the thickness direction, and the change in density is either change from high density to low density or change from low density to high density.

Alternatively, the transparent gas barrier layer in the transparent gas barrier film according to the present invention includes a plurality of layers in each of which the atomic ratio (X/M) of the above-described elements changes continuously and periodically in the thickness direction, and the change in atomic ratio is either change from high atomic ratio to low atomic ratio or change from low atomic ratio to high atomic ratio. The atomic ratio that changes as described above is the ratio of the content (X (atom %)) of an element derived from a reactant gas containing at least one element selected from the group consisting of oxygen, nitrogen, and carbon to the content (M (atom %)) of the at least one element selected from the group consisting of metals and metalloids.

The transparent gas barrier layer contains at least one kind selected from the group consisting of metals and metalloids. The at least one kind selected from the group consisting of metals and metalloids preferably is at least one kind selected from the group consisting of oxides, nitrides, carbides, oxynitrides, oxycarbides, carbonitrides, and oxycarbonitrides. Examples of the metals include aluminum, titanium, indium, and magnesium, and examples of the metalloids include silicon, bismuth, and germanium. In order to improve the gas barrier properties, it is preferable that the transparent gas barrier layer contains carbon and/or nitrogen, which make the network structure (net-like structure) in the transparent gas barrier layer dense. Furthermore, in order to improve the transparency, it is preferable that the transparent gas barrier layer contains oxygen. It is particularly preferable that the transparent gas barrier layer contains, as its components, at least one of a metal and a metalloid, together with all of carbon, oxygen, and nitrogen.

The transparent gas barrier layer is formed by, for example, a dry process utilizing vacuum, such as vapor deposition, sputtering, or chemical vapor deposition (CVD). This allows a very dense thin film having high gas barrier properties to be obtained. Among the above-described methods, vapor deposition is preferable. This is because vapor deposition is a highly-productive process that can form films very rapidly and thus can achieve excellent production efficiency. It is particularly preferable to form the transparent gas barrier layer by vapor deposition utilizing arc discharge plasma. It is known that arc discharge plasma has a very high electron density, unlike glow discharge plasma used commonly. By performing vapor deposition using arc discharge plasma, it is possible to enhance the reactivity, thus allowing a very dense transparent gas barrier layer to be formed.

Arc discharge plasma can be generated by, for example, a pressure gradient type plasma gun, a direct-current discharge plasma generator, or a high-frequency discharge plasma generator. Among them, it is preferable to use a pressure gradient type plasma gun, which can generate high-density plasma stably even during vapor deposition.

FIG. 1 is a schematic sectional view showing an example of the structure of the transparent gas barrier film according to the present invention. As shown in FIG. 1, this transparent gas barrier film 100 includes a transparent gas barrier layer 120 on a resin substrate 110. The transparent gas barrier layer 120 includes a plurality of layers each having a density that changes continuously and periodically in the thickness direction, and the change in density is either change from high density to low density or change from low density to high density. The expression that the density changes "periodically" as used herein means that the change from high density to low density or the change from low density to high density is repeated once or two or more times.

Figure 2:
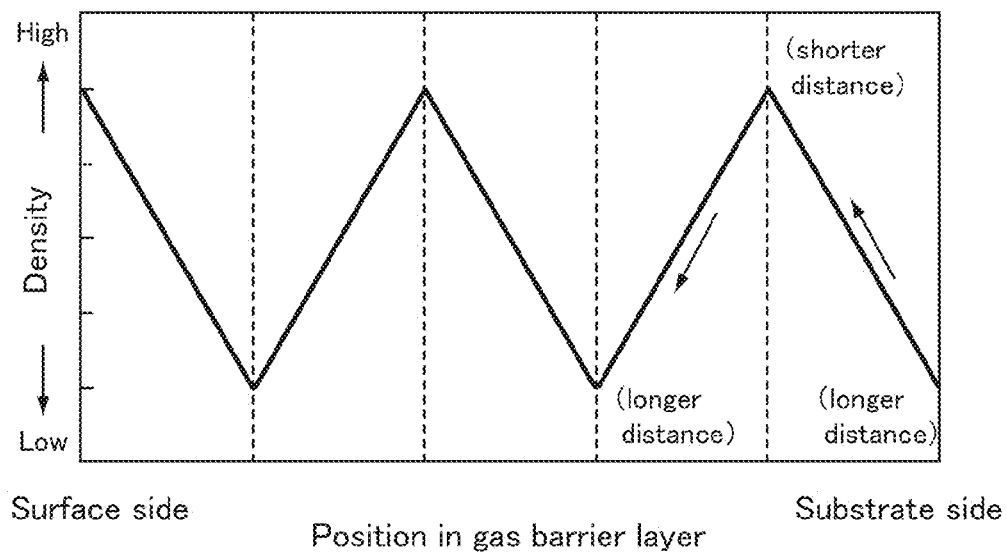
FIG. 2 is a schematic view showing an example of the density distribution in the thickness direction in a transparent gas barrier layer included in the transparent gas barrier film according to the present invention.
Figure 3:
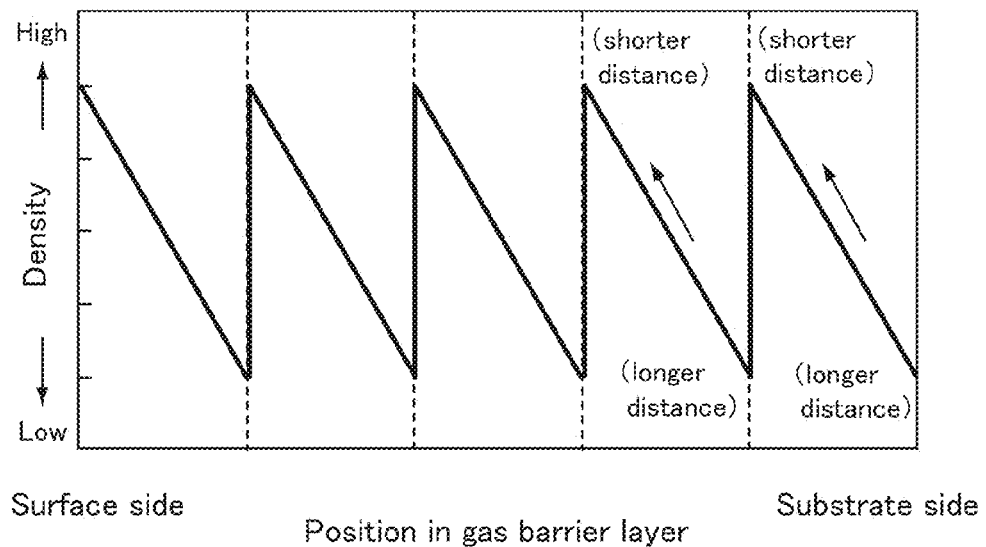
FIG. 3 is a schematic view showing another example of the density distribution in the thickness direction in a transparent gas barrier layer included in the transparent gas barrier film according to the present invention.

FIGS. 2 and 3 are schematic views each showing an example of the density distribution in the thickness direction in a gas barrier layer included in the transparent gas barrier film according to the present invention. In the example of the density distribution shown in FIG. 2, the following pattern is repeated: from the resin substrate side toward the surface side, the density increases gradually to reach a maximum density value, then decreases gradually to reach a minimum value, and again increases gradually (low density high density low density high density). In the example of the density distribution shown in FIG. 3, the following pattern is repeated: the density increases gradually from the resin substrate side toward the surface side (low density high density low density). The density may change either linearly or curvilinearly.

By forming a high-density layer, high gas barrier properties can be obtained. However, in the case where a high-density layer is thick or it forms a laminate with another layer(s), an internal stress increases to cause microcracks to be formed, so that the gas barrier properties are liable to be deteriorated. On this account, by configuring the gas barrier layer so as to include a plurality of layers each having a density that changes continuously and periodically in the thickness direction as described above, the internal stress can be reduced, so that microcracks are prevented from being formed. As a result, high gas barrier properties can be realized. When the change in density occurs on a constant thickness basis, the stress tends to be reduced more as compared with the case where the change in density occurs on a random thickness basis, although the reason therefor is not clear.

The inclined structures shown in FIGS. 2 and 3 are both effective in providing a transparent gas barrier layer having high flexibility. However, the structure shown in FIG. 3 is preferable, because a transparent gas barrier layer having a lower internal stress tends to be formed.

It is preferable that the ratio ($D_{max}/D_{min}$) of a maximum density value ($D_{max}$) to a minimum density value ($D_{min}$) in the transparent gas barrier layer is 1.1 or more. When the ratio of $D_{max}$ to $D_{min}$ is close to 1 and the difference between $D_{max}$ and $D_{min}$ thus is small, either a function of improving the gas barrier properties or a function of reducing the internal stress becomes insufficient. The density of the transparent gas barrier layer varies depending on the material and composition of the layer and the method for forming the layer. For example, a silicon oxide layer has a density from 1.6 to 2.2 g·cm$^{-3}$, and a silicon nitride layer has a density from 2.3 to 2.7 g·cm$^{-3}$.

In FIG. 1, the transparent gas barrier layer 120 has a plurality of layers in each of which the atomic ratio (X/M) changes continuously and periodically in the thickness direction, and the change in atomic ratio may be either change from high atomic ratio to low atomic ratio or change from low atomic ratio to high atomic ratio. The expression that the atomic ratio changes "periodically" as used herein means that the change from high atomic ratio to low atomic ratio or the change from low atomic ratio to high atomic ratio is repeated once or two or more times.

Figure 4:
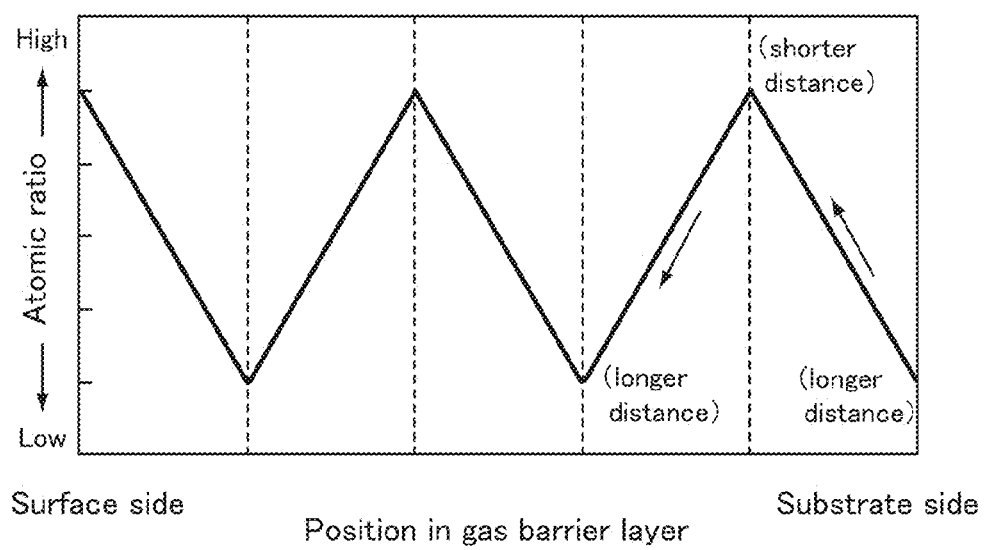
FIG. 4 is a schematic view showing an example of the atomic ratio distribution in the thickness direction in a transparent gas barrier layer included in the transparent gas barrier film according to the present invention.

FIG. 4 is a schematic view showing an example of the atomic ratio distribution, which is, for example, distribution of the atomic ratio (X/M) of a reactant gas element to a metal element, in the thickness direction in a transparent gas barrier layer included in the transparent gas barrier film according to the present invention. In the example of the atomic ratio distribution shown in FIG. 4, the following pattern is repeated: from the resin substrate side toward the surface side, the atomic ratio increases gradually to reach a maximum value, then decreases gradually to reach a minimum value, and again increases gradually (high atomic ratio→low atomic ratio→high atomic ratio). The atomic ratio may change either linearly or curvilinearly, for example.

When the atomic ratio of any one of oxygen, carbon, and nitrogen, which are the elements contained in the reactant gas, is high in the transparent gas barrier layer, the transparent gas barrier layer can be made dense owing to high reactivity. As a result, high gas barrier properties can be obtained. However, when a layer in which this atomic ratio is high is thick or it forms a laminate with another layer(s), an internal stress increases, so that microcracks are liable to be formed. The gas barrier properties of the transparent gas barrier film are deteriorated by the formation of these microcracks. On this account, according to the present invention, by configuring the gas barrier layer so as to include a plurality of layers in each of which the atomic ratio changes continuously and periodically as described above, the internal stress can be reduced, so that microcracks are prevented from being formed. As a result, high gas barrier properties can be realized.

When the transparent gas barrier layer contains oxygen, the atomic ratio ($X_O/M$) preferably is in the range from 1 to 1.9. When the transparent gas barrier layer contains nitrogen, the atomic ratio ($X_N/M$) preferably is in the range from 0.5 to 1.2. When the transparent gas barrier layer contains carbon, the atomic ratio ($X_C/M$) preferably is in the range from 0.5 to 1.7. As a result of diligent study, the inventors of the present invention found out that the atomic ratios of these elements are closely related to the layer density, and it is likely that the layer density increases as the atomic ratio becomes higher and decreases as the atomic ratio becomes lower. When the atomic ratio is in the above-described range, the layer density falls within a more suitable range. Thus, for example, the resultant transparent gas barrier layer can exhibit higher gas barrier properties and also higher flexibility because the internal stress can be reduced further.

The thickness of the transparent gas barrier layer preferably is not more than 1 μm, more preferably in the range from 100 to 800 nm, and still more preferably in the range from 200 to 500 nm, from the viewpoint of the gas barrier properties, the transparency, the time required for film formation, and the internal stress of the layer. Preferably, the layers each having a density that changes in the thickness direction or in each of which the atomic ratio changes in the thickness direction each have a thickness in the range from 50 to 200 nm, more preferably from 20 to 200 nm or 10 to 100 nm. The number of these layers preferably is in the range from 3 to 20, more preferably from 5 to 16.

As the resin substrate, it is preferable to use a film that is excellent in heat resistance, in particular, excellent in Tg (glass transition temperature) and heat-shrinkage resistance, considering the influence of heating by arc discharge plasma or by radiant heat from a vapor deposition source. When the film is inferior in these properties, it is considered that, at the time of forming a transparent gas barrier layer, strain may be caused in the film and cracks and the like may be formed in the transparent gas barrier layer, resulting in deterioration in gas barrier properties. On this account, a transparent film with high heat resistance is preferable as the resin substrate. For example, it is preferable that the film has a shrinkage rate of not more than 0.5% both in the width direction (TD) and in the machine direction (MD). Examples of the resin substrate in the present invention include films having transparency, such as those formed of cycloolefin polymer, polyethylene naphthalate, polyethylene sulfide, polyphenyl sulfide, polycarbonate, polyimide, or polyamide. The thickness of the resin substrate preferably is from 20 to 200 μm, and particularly preferably is from 50 to 150 μm from the viewpoint of handling.

The resin substrate in the present invention may be subjected to a surface treatment such as, for example, a corona discharge treatment, a plasma discharge treatment, or an ion etching (RIE) treatment, before forming the transparent gas barrier layer thereon. Also, over the resin substrate, a layer(s) of an inorganic substance or a polymer may be formed by a vacuum process or coating as a smooth layer or an adhesive layer.

In the present invention, when the at least one kind selected from the group consisting of metals and metalloids is selected from the group consisting of oxides, nitrides, carbides, oxynitrides, oxycarbides, carbonitrides, and oxycarbonitrides, it is possible to introduce oxygen, carbon, or nitrogen contained in the oxides, nitrides, carbides, oxynitrides, oxycarbides, carbonitrides, and oxycarbonitrides by generating arc discharge plasma in the presence of a reactant gas and vapor-depositing the at least one kind selected from the group consisting of the metals and the metalloids, for example. As a vapor deposition material to be used in the vapor deposition, it is also possible to use a metal oxide or a metalloid oxide, for example. As the reactant gas, it is possible to use oxygen-containing gas, nitrogen-containing gas, hydrocarbon-containing gas, or a mixed gas obtained by mixing them in any combination, for example.

Examples of the oxygen-containing gas include oxygen ($O_2$), dinitrogen monoxide ($N_2O$), and nitrogen monoxide (NO). Examples of the nitrogen-containing gas include nitrogen ($N_2$), ammonia ($NH_3$), and nitrogen monoxide (NO). Examples of the hydrocarbon-containing gas include methane ($CH_4$), ethane ($C_2H_6$), propane ($C_3H_8$), butane ($C_4H_{10}$), ethylene ($C_2H_4$), and acetylene ($C_2H_2$).

As means for evaporating the vapor deposition material, it is possible to employ a method of applying any one of resistance heating, an electron beam, and arc discharge plasma to the vapor deposition material (vapor deposition source), for example. Among them, a method using an electron beam or arc discharge plasma is preferable, because high-speed vapor deposition is possible. These methods may be used in combination.

The transparent gas barrier film can be produced by, in the step of forming the transparent gas barrier layer, performing the vapor deposition while changing the distance between the resin substrate and a plasma source, for example. It is to be noted, however, that the present invention is not limited thereto.

Figure 5:
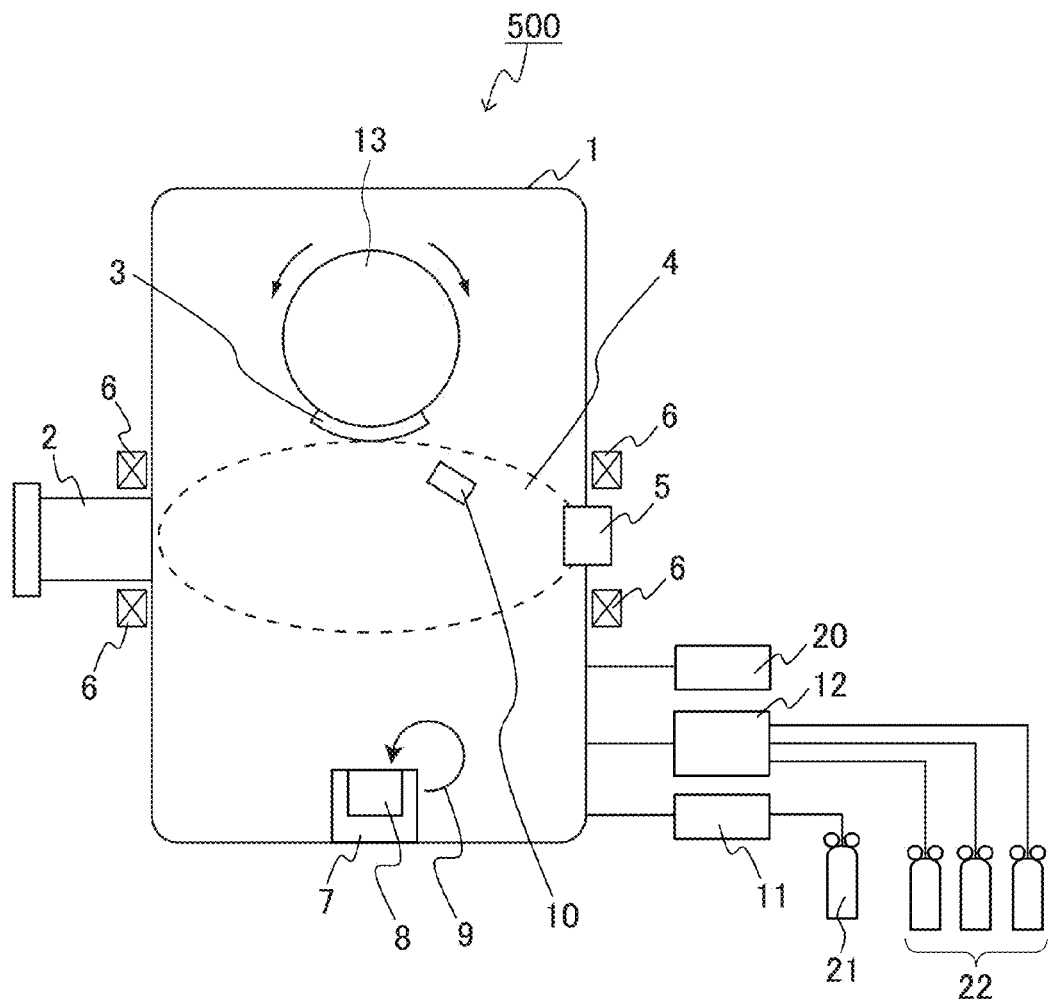
FIG. 5 is a schematic view showing an example of the structure of an apparatus for producing the transparent gas barrier film according to the present invention.

FIG. 5 shows an example of the structure of an apparatus for producing the transparent gas barrier film according to the present invention in a batch production system. As can be seen from FIG. 5, this production apparatus 500 includes, as main components: a vacuum chamber 1; a pressure gradient type plasma gun 2; a reflecting electrode 5; a converging electrode 6; a vapor deposition source 7; a discharge gas supply unit 11; a reactant gas supply unit 12; and a vacuum pump 20. In the vacuum chamber 1, a substrate roll 13 is disposed, and a resin substrate (e.g., a transparent resin film) 3 is set on the substrate roll 13. The vapor deposition source 7 is disposed at the bottom of the vacuum chamber 1 so as to face the substrate roll 13. A vapor deposition material 8 is set on the upper surface of the vapor deposition source 7. The vacuum pump 20 is disposed on a side wall of the vacuum chamber 1 (the right side wall in FIG. 5). By this vacuum pump 20, the pressure in the vacuum chamber 1 can be reduced. The discharge gas supply unit 11 and the reactant gas supply unit 12 are disposed on the side wall of the vacuum chamber 1 (the right side wall in FIG. 5). The discharge gas supply unit 11 is connected to a gas cylinder 21 for a discharge gas. With this configuration, it is possible to supply a discharge gas (e.g., argon gas) at a suitable pressure to the vacuum chamber 1. The reactant gas supply unit 12 is connected to a gas cylinder 22 for a reactant gas. With this configuration, it is possible to supply a reactant gas (e.g., oxygen gas, nitrogen gas, or methane gas) at a suitable pressure to the vacuum chamber 1. To the substrate roll 13, a temperature control unit (not shown) is connected. With this configuration, it is possible to set the temperature of the resin substrate 3 within a predetermined range by adjusting the surface temperature of the substrate roll 13. Examples of the temperature control unit include a heat medium circulation device that circulates silicone oil or the like.

An example of the production process using the production apparatus shown in FIG. 5 is as follows. The vacuum chamber 1 is exhausted so as to make the pressure therein not more than $10^{-3}$ Pa. Thereafter, to the pressure gradient type plasma gun 2 as an arc discharge plasma-generating source, argon is introduced as a discharge gas from the discharge gas supply unit 11. A constant voltage is applied to the pressure gradient type plasma gun 2, thereby causing the pressure gradient type plasma gun 2 to emit a plasma beam 4 toward the reflecting electrode 5 in such a manner that the resin substrate 3 is irradiated with the plasma beam 4. The plasma beam 4 is controlled by the converging electrode 6 so as to have a predetermined shape. The output of the arc discharge plasma is 1 to 10 kW, for example. On the other hand, from the reactant gas supply unit 12, a reactant gas is introduced. The vapor deposition material 8 set in the vapor deposition source 7 is irradiated with an electron beam 9 so as to evaporate the material toward the resin substrate 3. By performing the vapor deposition in the presence of the reactant gas, a predetermined transparent gas barrier layer is formed over the resin substrate 3. The formation speed (vapor deposition speed) of the transparent gas barrier layer is measured and controlled by a quartz monitor 10 set in the vicinity of the resin substrate 3. It is preferable that a shutter (not shown) that covers the resin substrate 3 is closed after the start of the evaporation until the vapor deposition speed is stabilized, and after the vapor deposition speed has been stabilized, the shutter is opened to start the formation of the transparent gas barrier layer.

At this time, by rotating the substrate roll 13, it is possible to change the distance between the resin substrate 3 and the plasma gun 2. When the resin substrate 3 set on the substrate roll 13 is transferred from a position close to the plasma gun 2 (on the left in FIG. 5) to a position far from the plasma gun 2 (on the right in FIG. 5), a high density layer is obtained at the position close to the plasma gun 2 because the density of the plasma is relatively high. Also, because the density of the plasma is relatively high at the position close to the plasma gun 2, high reactivity is exhibited so that a high density layer in which the atomic ratio of the reactant gas element is high is obtained. In contrast, because the density of the plasma is relatively low at the position far from the plasma gun 2, a low density layer is obtained. Also, because the density of the plasma is relatively low at the position far from the plasma gun 2, low reactivity is exhibited so that a low density layer in which the atomic ratio of the reactant gas element is low is obtained. Accordingly, by performing the vapor deposition while repeating the rotation of the substrate roll 13 in the same direction, it is possible to form a transparent gas barrier layer having the density change as shown in FIG. 3, for example. Alternatively, by performing the vapor deposition while repeating the rotation of the substrate roll 13 in the forward direction and in the reverse direction alternately, it is possible to form a transparent gas barrier layer having the density change as shown in FIG. 2, for example, or a transparent gas barrier layer having the atomic ratio change as shown in FIG. 4, for example.

The pressure in the system at the time of forming the transparent gas barrier layer is, for example, in the range from 0.01 Pa to 0.1 Pa, preferably from 0.02 Pa to 0.05 Pa. The temperature of the substrate is, for example, in the range from 20° C. to 200° C., preferably from 80° C. to 150° C. The generation of the arc discharge plasma and the introduction of the reactant gas may be performed either simultaneously or with a time lag. The introduction of the reactant gas may be performed simultaneously with the generation of the plasma. Alternatively, the plasma may be generated after the introduction of the reactant gas, or the reactant gas may be introduced after the generation of the plasma. The reactant gas needs to be present in the system at the time of forming the transparent gas barrier layers.

The organic EL element according to the present invention includes: a substrate; and a laminate including an anode layer, an organic EL (electroluminescence) layer, and a cathode layer in this order, with the laminate being provided on the substrate. The organic EL element is characterized in that the substrate is the transparent gas barrier film according to the present invention. The anode layer is, for example, a layer formed of ITO (Indium Tin Oxide) or IZO (registered trademark, Indium Zinc Oxide), which can be used as a transparent electrode layer. The organic EL layer includes, for example, a hole injection layer, a hole transport layer, a light-emitting layer, an electron transport layer, and an electron injection layer. As the cathode layer, an aluminum layer, a magnesium/aluminum layer, a magnesium/silver layer, or the like that also serves as a reflecting layer is formed, for example. In order to prevent this laminate from being exposed to the air, sealing with a metal, glass, a resin, or the like is provided from above the cathode layer.

The organic EL element according to the present invention may be configured so as to further include a rear surface sealing member. This organic EL element is characterized in that the laminate is at least partially covered with the rear surface sealing member, and at least one of the substrate and the rear surface sealing member is the transparent gas barrier film according to the present invention. That is, the transparent gas barrier film according to the present invention also can be used as a rear surface sealing member of an organic EL element. In this case, by providing the transparent gas barrier film according to the present invention on the laminate using an adhesive or by heat sealing or the like, it is possible to maintain sufficient sealability. It is also possible to use the laminate as a resin substrate and provide sealing by forming the transparent gas barrier layer in the transparent gas barrier film according to the present invention on a portion of the laminate that needs to be covered.

When the transparent gas barrier film according to the present invention is used as a substrate of an organic EL element, it is possible to reduce the weight and the thickness of the organic EL element and to impart flexibility to the organic EL element. Therefore, when the organic EL element is used as a display, it can be a flexible display. Such a flexible display can be rolled up, for example, so that it becomes possible to use it as electronic paper. When the transparent gas barrier film according to the present invention is used as the rear surface sealing member, the laminate can be covered easily, and also, it becomes possible to reduce the thickness of the organic EL element.

The solar battery according to the present invention includes a solar battery cell, and is characterized in that the solar battery cell is covered with the transparent gas barrier film according to the present invention. The transparent gas barrier film according to the present invention can be used suitably also as a light receiving-side front sheet and a protective back sheet of a solar battery. One example of the structure of the solar battery is as follows: a solar battery cell formed of a thin film silicon or a CIGS (Copper Indium Gallium DiSelenide) thin film is sealed with a resin such as ethylene-vinyl acetate copolymer, and the thus-sealed solar battery cell is sandwiched between the transparent gas barrier films according to the present invention. The solar battery cell may be sandwiched between the transparent gas barrier films according to the present invention directly without being sealed with the resin.

The thin film battery according to the present invention includes a laminate including a current collecting layer, an anode layer, a solid electrolyte layer, a cathode layer, and another current collecting layer provided in this order, and is characterized in that the laminate is covered with the transparent gas barrier film according to the present invention. Examples of the thin film battery include a thin film lithium ion battery. Typically, the thin film battery is configured so that a current collecting layer using a metal, an anode layer using a metal inorganic film, a solid electrolyte layer, a cathode layer, and another current collecting layer using a metal are laminated in sequence on a substrate. The transparent gas barrier film according to the present invention can be used also as a substrate of a thin film battery.

EXAMPLES

Next, examples of the present invention will be described together with comparative examples. It is to be noted, however, that the present invention is by no means limited or restricted by the following examples and comparative examples. Various characteristics and physical properties described in the respective examples and comparative examples were measured and evaluated by the following methods.

(Water Vapor Transmission Rate)

The water vapor transmission rate (WVTR) was measured using a water vapor transmission rate testing system (manufactured by MOCON, trade name: PERMATRAN) specified by JIS K7126 in an environment where the temperature was 40° C. and the humidity was 90% RH. The measurement rang of the water vapor transmission rate testing system is not less than 0.005 $g \cdot m^{-2} \cdot day^{-1}$.

(Bending Test)

According to a cylindrical mandrel method (JIS K5600-5-1, with the use of a testing apparatus manufactured by COTEC Corporation), each transparent gas barrier film was bent 1000 times with its transparent gas barrier layer on the outside using a mandrel having a diameter of 20 mm. Thereafter, the WVTR was measured in the above-described manner.

(Thickness of Each Layer Included in Transparent Gas Barrier Film)

The thickness of each layer included in the transparent gas barrier film was determined by observing the cross section of the transparent gas barrier film with a scanning electron microscope (trade name: JSM-6610) manufactured by Jeol Ltd., measuring the length from the surface of the substrate (film) to the surface of each layer, and then calculating the thickness of each layer.

(Density of Each Layer Included in the Transparent Gas Barrier Film)

The density ρ of each layer included in the transparent gas barrier film was determined by measuring the X-ray reflectance of each layer included in the transparent gas barrier layer with an X-ray diffraction apparatus (trade name: SMART LAB) manufactured by Rigaku Corporation and then calculating the density of each layer. In general, the electron beam transmittance becomes lower as the film density increases. Thus, a portion with a high film density is observed as a dark image, because electron beams hardly can pass through the portion. In contrast, the electron beam transmittance becomes higher as the film density decreases. Thus, a portion with a low film density is observed as a bright image, because electron beams can pass through the portion easily. Therefore, it is considered that change in contrast in an image correlates with the change in layer density.

(Change in Atomic Ratio in Each Layer Included in the Transparent Gas Barrier Film)

The change in atomic ratio in each layer was determined by etching the transparent gas barrier layer from the surface thereof to a given depth with Ar ions and measuring the atomic ratio in the thickness direction using an X-ray photoelectron spectrum measurement system (ULVAC-PHI, Inc.).

Example 1

Preparation of Transparent Resin Film

As a transparent resin film (resin substrate), a polyethylene naphthalate film (thickness: 100 μm, trade name "TEONEX") manufactured by Teijin DuPont Films Japan Limited was provided.

<Step of Forming Transparent Gas Barrier Layer>

Next, the polyethylene naphthalate film was set in the production apparatus shown in FIG. 5. Argon gas was introduced into the pressure gradient type plasma gun at 20 sccm ($20 \times 1.69 \times 10^{-3}$ $Pa \cdot m^3$/second). Arc discharge plasma was generated by applying a discharge output of 5 kW to the plasma gun. As reactant gases, oxygen (purity 5N: 99. 999%) was introduced into the vacuum chamber at a flow rate of 10 sccm ($10 \times 1.69 \times 10^{-3}$ $Pa \cdot m^3$/second), and nitrogen (purity 5N: 99. 999%) was introduced into the vacuum chamber at a flow rate of 20 sccm ($20 \times 1.69 \times 10^{-3}$ $Pa \cdot m^3$/second). In this state, silicon particles (purity 3N: 99.9%) as a vapor deposition material were irradiated with an electron beam (accelerating voltage: 6 kV, applied current: 50 mA) so as to evaporate the vapor deposition material at a vapor deposition speed of 100 nm/min. At this time, the pressure in the system was set to $2.0 \times 10^{-2}$ Pa, and the temperature of a heater for heating the substrate was set to 100° C. The step of rotating the substrate roll 13 from the plasma gun 2 side to the left in FIG. 5 (the change to extend the distance) and the subsequent step of rotating the substrate roll 13 from the converging electrode 6 side to the right in FIG. 5 (the change to shorten the distance) were repeated to a total of five times each. The rotational speed of the substrate roll 13 was set to 0.5 m/min.

Figure 6:
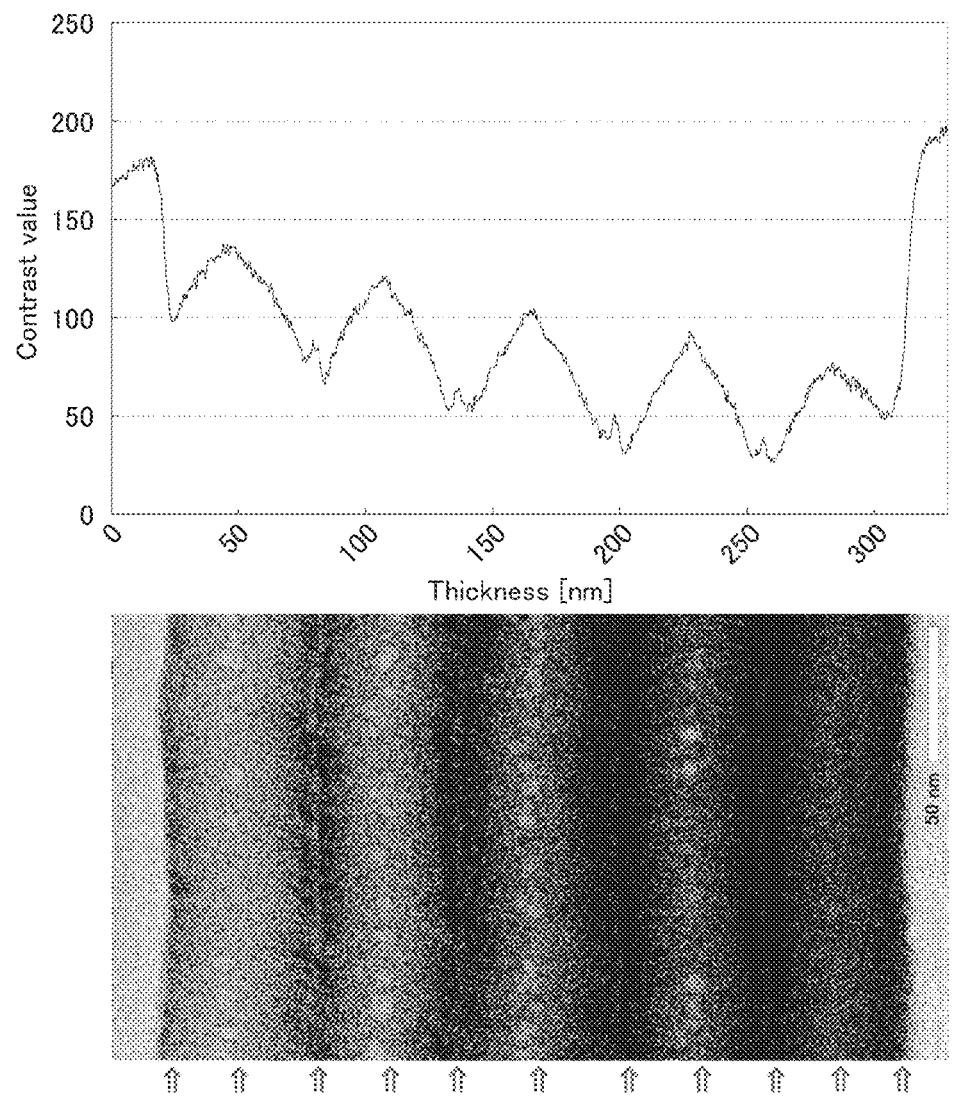
FIG. 6 shows the result of image analysis with respect to a transparent gas barrier film obtained in Example 1.

The interlayer structure and the density of the thus-obtained transparent gas barrier layer were analyzed. FIG. 6 shows the result of image analysis with respect to the thus-obtained transparent gas barrier layer. In this transparent gas barrier layer, a maximum density value was 2.68 $g \cdot cm^{-3}$ and a minimum density value was 2.30 $g \cdot cm^{-3}$. The number of the layers each having a density that changes in the thickness direction was ten, and they each had a thickness of about 30 nm.

Example 2

A transparent gas barrier film of the present example was obtained in the same manner as in Example 1, except that the end point of the left rotation and the start point of the right rotation were set to be farther from the plasma gun 2 as compared to those in Example 1.

The interlayer structure and the density of the thus-obtained transparent gas barrier layer were analyzed. In transparent gas barrier layer, a maximum density value was 2.68 $g \cdot cm^{-3}$ and a minimum density value was 2.20 $g \cdot cm^{-3}$. The number of the layers each having a density that changes in the thickness direction was ten, and they each had a thickness of about 30 nm.

Example 3

A transparent gas barrier film of the present example was obtained in the same manner as in Example 1, except that the end point of the left rotation and the start point of the right rotation were set to be closer to the plasma gun 2 as compared to those in Example 1.

The interlayer structure and the density of the thus-obtained transparent gas barrier layer were analyzed. In the transparent gas barrier layer, a maximum density value was 2.68 $g \cdot cm^{-3}$ and a minimum density value was 2.45 $g \cdot cm^{-3}$. The number of the layers each having a density that changes in the thickness direction was ten, and they each had a thickness of about 30 nm.

Example 4

A transparent gas barrier film of the present example was obtained in the same manner as in Example 1, except that the substrate roll 13 was rotated four times in one direction from the plasma gun 2 side to the left in FIG. 5 (the change to extend the distance).

Figure 7:
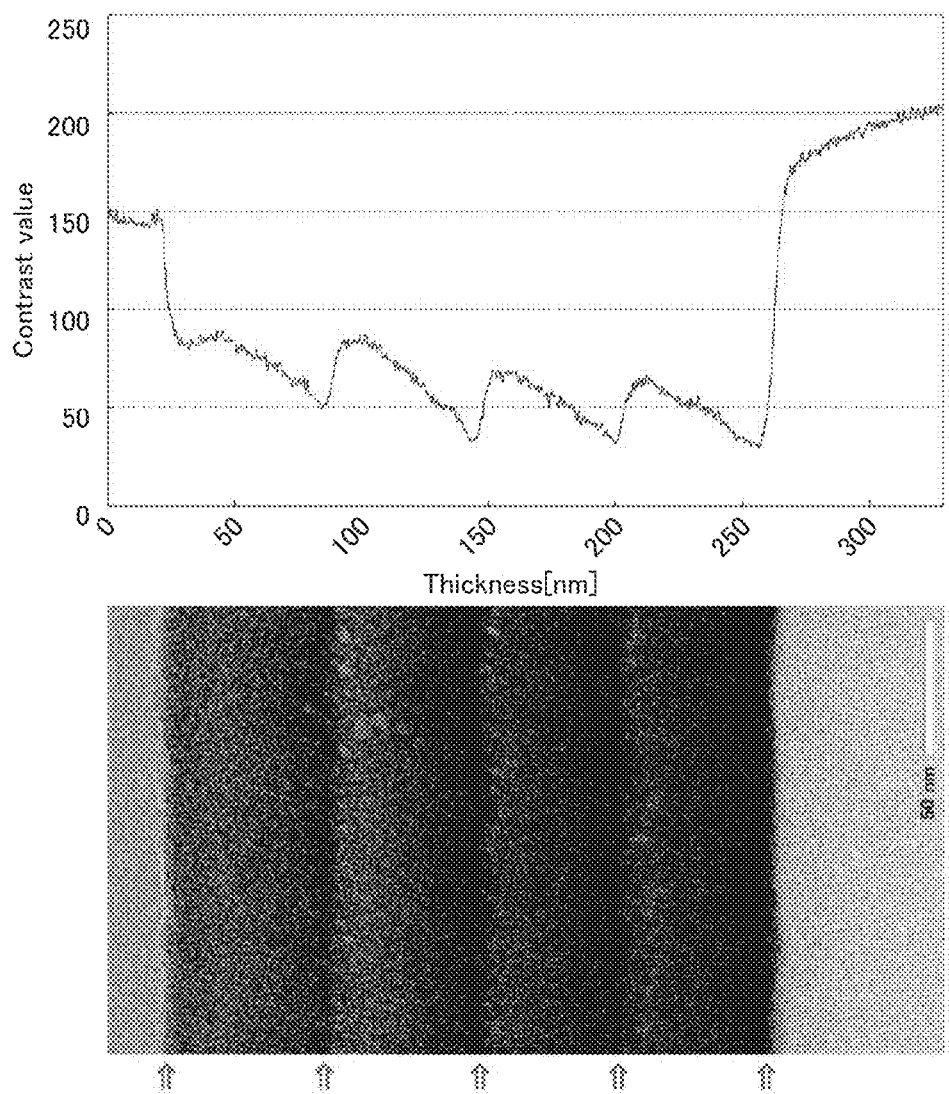
FIG. 7 shows the result of image analysis with respect to a transparent gas barrier film obtained in Example 4.

The interlayer structure and the density of the thus-obtained transparent gas barrier layer were analyzed. FIG. 7 shows the result of image analysis with respect to the thus-obtained transparent gas barrier layer. In this transparent gas barrier layer, a maximum density value was 2.68 g·cm$^{-3}$ and a minimum density value was 2.30 g·cm$^{-3}$. The number of the layers each having a density that changes in the thickness direction was four, and they each had a thickness of about 60 nm.

Comparative Example 1

A transparent gas barrier layer was formed with the substrate roll 13 being fixed instead of being rotated. Argon gas was introduced into the pressure gradient type plasma gun at 20 sccm (20×1.69×10$^{-3}$ Pa·m$^3$/second). Arc discharge plasma was generated by applying a discharge output of 5 kW to the plasma gun. As reactant gases, oxygen (purity 5N: 99.999%) was introduced into the vacuum chamber at a flow rate of 10 sccm (10×1.69 10$^{-3}$ Pa·m$^3$/second), and nitrogen (purity 5N: 99.999%) was introduced into the vacuum chamber at a flow rate of 20 sccm (20×1.69×10$^{-3}$ Pa·m$^3$/second). In this state, silicon particles (purity 3N: 99.9%) as a vapor deposition material were irradiated with an electron beam (accelerating voltage: 6 kV, applied current: 50 mA) so as to evaporate the vapor deposition material at a vapor deposition speed of 100 nm/min. Thus, a silicon oxynitride layer was vapor-deposited on the substrate so that the thickness thereof became 50 nm. Subsequently, the discharge output applied to the plasma gun was set to 2 kW, and a silicon oxynitride layer was vapor-deposited in the same manner so that the thickness thereof became 50 nm. At this time, the pressure in the system was set to 2.0×10$^{-2}$ Pa, and the temperature of a heater for heating the substrate was set to 100° C. By repeating these processes alternately, eight layers each having a thickness of 50 nm were formed in total. Thus, a transparent gas barrier film of the present comparative example was obtained.

Regarding the thus-obtained transparent gas barrier layer, the thickness and the density of each layer were analyzed. The layers formed when the discharge output was set to 5 kW each had a density of 2.68 g·cm$^{-3}$, and the layers formed when the discharge output was set to 2 kW each had a density of 2.30 g·cm$^{-3}$.

Example 5

Preparation of Transparent Resin Film

As a transparent resin film (resin substrate), a polyethylene naphthalate film (thickness: 100 μm, trade name "TEONEX") manufactured by Teijin DuPont Films Japan Limited was provided.

<Step of Forming Transparent Gas Barrier Layer>

Next, the polyethylene naphthalate film was set in the production apparatus shown in FIG. 5. Argon gas was introduced into the pressure gradient type plasma gun at 20 sccm (20×1.69×10$^{-3}$ Pa·m$^3$/second). Arc discharge plasma was generated by applying a discharge output of 5 kW to the plasma gun. As a reactant gas, nitrogen (purity 5N: 99.999%) was introduced into the vacuum chamber at a flow rate of 20 sccm (20×1.69×10$^{-3}$ Pa·m$^3$/second). In this state, silicon particles (purity 3N: 99.9%) as a vapor deposition material were irradiated with an electron beam (accelerating voltage: 6 kV, applied current: 50 mA) so as to evaporate the vapor deposition material at a vapor deposition speed of 100 nm/min. At this time, the pressure in the system was set to 2.0×10$^{-2}$ Pa, and the temperature of a heater for heating the substrate was set to 100° C. The step of rotating the substrate roll 13 from the plasma gun 2 side to the left in FIG. 5 (the change to extend the distance) and the subsequent step of rotating the substrate roll 13 from the reflecting electrode 5 side to the right in FIG. 5 (the change to shorten the distance) were repeated to a total of five times each. The rotational speed of the substrate roll 13 was set to 0.5 m/min. The layers (ten layers in total) each having a density that changes in the thickness direction each had a thickness of about 30 nm.

Figure 8:
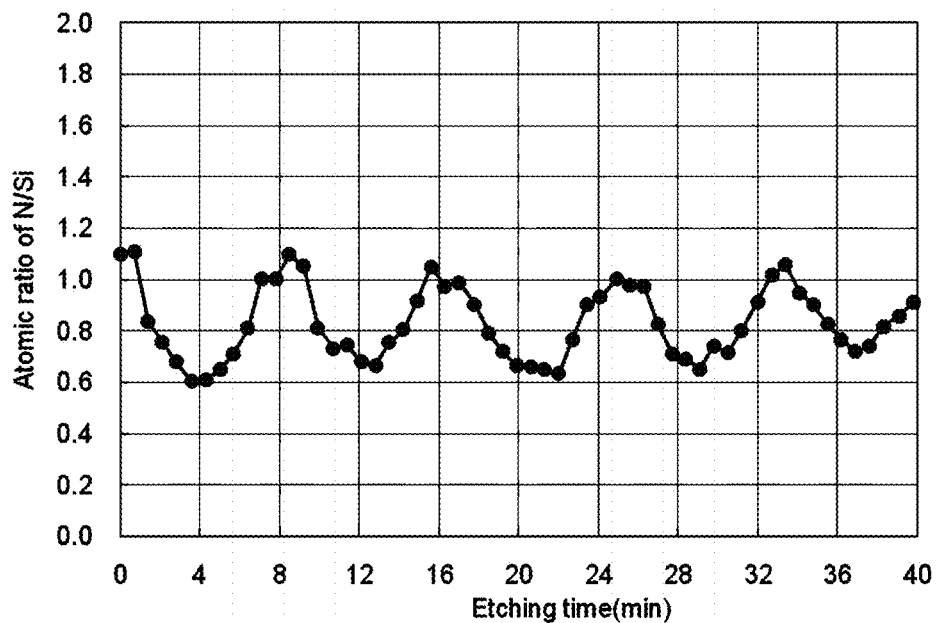
FIG. 8 is a graph showing the change in atomic ratio N/Si ($X_N/M$) in the thickness direction in a transparent gas barrier layer in Example 5.

Regarding the thus-obtained transparent gas barrier layer, the atomic ratio N/Si ($X_N$/M) in the thickness direction in the layer was analyzed. FIG. 8 shows the change in atomic ratio N/Si in the depth direction from the surface of the transparent gas barrier layer. As shown in FIG. 8, in the transparent gas barrier layer, a maximum value of the atomic ratio N/Si was 1.1, and a minimum value of the same was 0.6.

Example 6

A transparent gas barrier film of the present example was obtained in the same manner as in Example 5, except that, as a reactant gas, oxygen (purity 5N: 99.999%) was introduced into the vacuum chamber at a flow rate of 30 sccm (30×1.69×10$^{-3}$ Pa·m$^3$/second).

Figure 9:
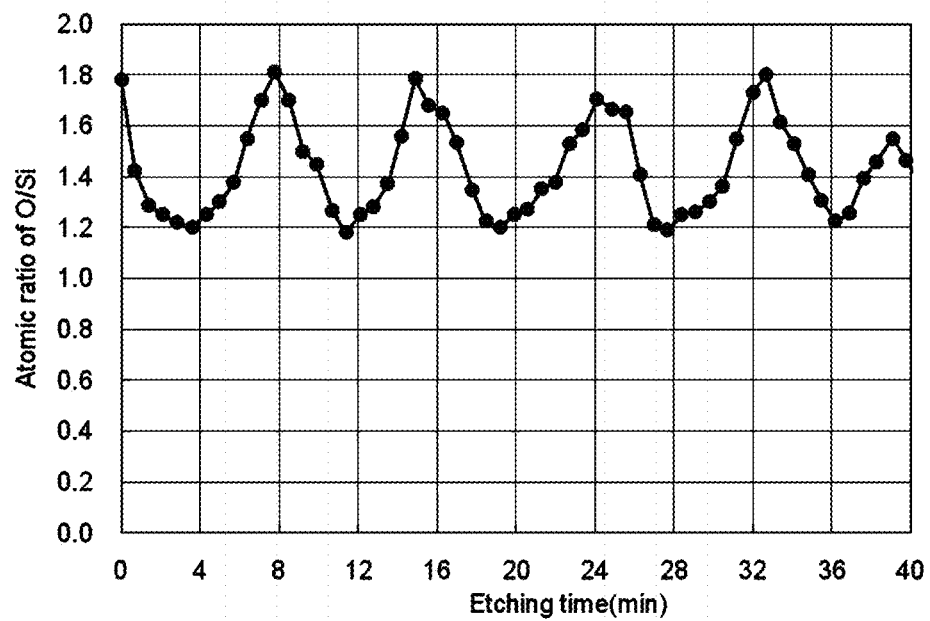
FIG. 9 is a graph showing the change in atomic ratio O/Si ($X_O/M$) in the thickness direction in a transparent gas barrier layer in Example 6.

Regarding the thus-obtained transparent gas barrier layer, the atomic ratio O/Si ($X_O$/M) in the thickness direction of the layer was analyzed. FIG. 9 shows the change in atomic ratio O/Si in the depth direction from the surface of the transparent gas barrier layer. As shown in FIG. 9, in the transparent gas barrier layer, a maximum value of the atomic ratio O/Si was 1.8, and a minimum value of the same was 1.2.

Example 7

A transparent gas barrier film of the present example was obtained in the same manner as in Example 5, except that, as a reactant gas, methane (purity 4N: 99.99%) was introduced into the vacuum chamber at a flow rate of 15 sccm (15×1.69×10$^{-3}$ Pa·m$^3$/second).

Figure 10:
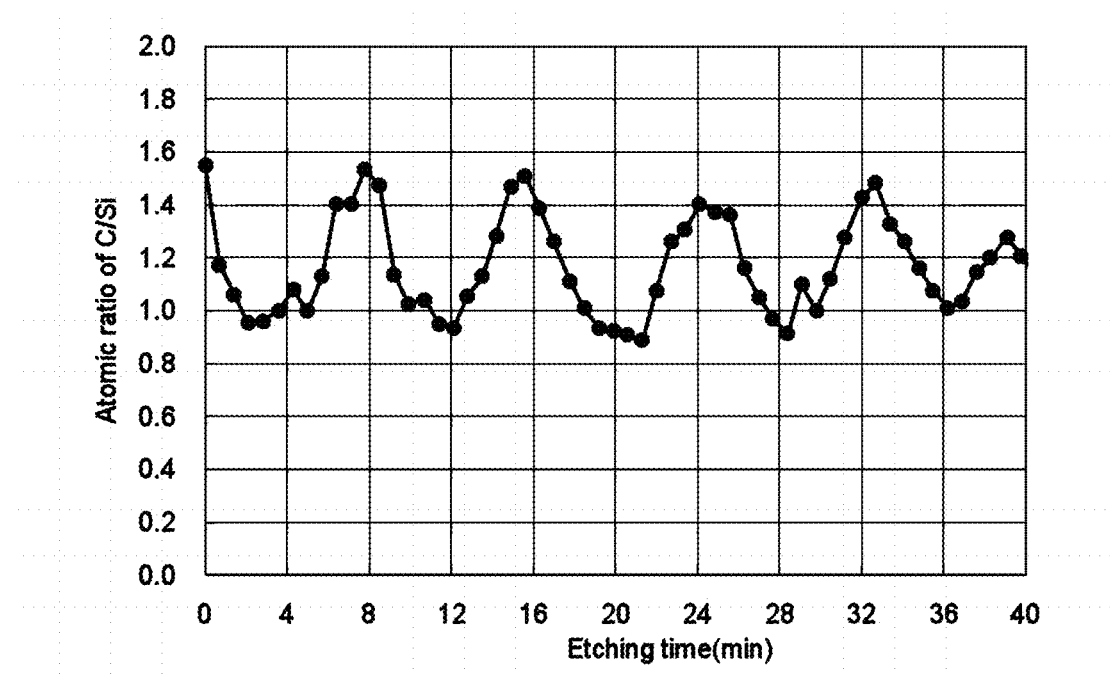
FIG. 10 is a graph showing the change in atomic ratio C/Si ($X_C/M$) in the thickness direction in a transparent gas barrier layer in Example 7.

Regarding the thus-obtained transparent gas barrier layer, the atomic ratio C/Si ($X_C$/M) in the thickness direction of the layer was analyzed. FIG. 10 shows the change in atomic ratio C/Si in the depth direction from the surface of the transparent gas barrier layer. As shown in FIG. 10, in the transparent gas barrier layer, a maximum value of the atomic ratio C/Si was 1.5, and a minimum value of the same was 0.9.

Comparative Example 2

A transparent gas barrier layer was formed with the substrate roll 13 being fixed instead of being rotated. Argon gas was introduced into the pressure gradient type plasma gun at 20 sccm (20×1.69×10$^{-3}$ Pa·m$^3$/second). Arc discharge plasma was generated by applying a discharge output of 5 kW to the plasma gun. As a reactant gas, nitrogen (purity 5N: 99.999%) was introduced into the vacuum chamber at a flow rate of 20 sccm (20×1.69×10$^{-3}$ Pa·m$^3$/second). In this state, silicon particles (purity 3N: 99.9%) as a vapor deposition material were irradiated with an electron beam (accelerating voltage: 6 kV, applied current: 50 mA) so as to evaporate the vapor deposition material at a vapor deposition speed of 100 nm/min. Thus, a silicon nitride layer was vapor-deposited on the substrate so that the thickness thereof became 30 nm. Subsequently, the discharge output applied to the plasma gun was set to 2 kW, and a silicon nitride layer was vapor-deposited in the same manner so that the thickness thereof became 30 nm. At this time, the pressure in the system was set to $2.0 \times 10^{-2}$ Pa, and the temperature of a heater for heating the substrate was set to 100° C. By repeating these processes alternately, ten layers each having a thickness of 30 nm were formed in total. Thus, a transparent gas barrier film of the present comparative example was obtained.

Regarding the thus-obtained transparent gas barrier layer, the atomic ratio N/Si in the thickness direction was analyzed. In the transparent gas barrier layer, the atomic ratio N/Si was constant at 1.2, regardless of the position in the thickness direction.

Comparative Example 3

A transparent gas barrier film of the present comparative example was obtained in the same manner as in Comparative Example 2, except that, as a reactant gas, oxygen (purity 5N: 99. 999%) was introduced into the vacuum chamber at a flow rate of 30 sccm ($30 \times 1.69 \times 10^{-3}$ Pa·m³/second).

Regarding the thus-obtained transparent gas barrier layer, the atomic ratio O/Si in the thickness direction was analyzed. In the transparent gas barrier layer, the atomic ratio O/Si was constant at 1.8, regardless of the position in the thickness direction.

Comparative Example 4

A transparent gas barrier film of the present comparative example was obtained in the same manner as in Comparative Example 2, except that, as a reactant gas, methane (purity 4N: 99. 99%) was introduced into the vacuum chamber at a flow rate of 15 sccm ($15 \times 1.69 \times 10^{-3}$ Pa·m³/second).

Regarding the thus-obtained transparent gas barrier layer, the atomic ratio C/Si in the thickness direction was analyzed. In the transparent gas barrier layer, the atomic ratio C/Si was constant at 1.5, regardless of the position in the thickness direction.

Regarding each of the transparent gas barrier films obtained in Examples 1 to 7 and Comparative Examples 1 to 4, the water vapor transmission rate (WVTR) was measured before and after the bending test. The measurement results are shown in Tables 1 and 2.

TABLE 1

|  | Before bending test (g · m⁻² · day⁻¹) | After bending test (g · m⁻² · day⁻¹) |
| --- | --- | --- |
| Ex. 1 | 0.005 | 0.005 |
| Ex. 2 | 0.005 | 0.005 |
| Ex. 3 | 0.005 | 0.007 |
| Ex. 4 | 0.007 | 0.007 |
| Comp. Ex. 1 | 0.005 | 0.010 |

TABLE 2

|  | Before bending test (g · m⁻² · day⁻¹) | After bending test (g · m⁻² · day⁻¹) |
| --- | --- | --- |
| Ex. 5 | 0.005 | 0.005 |
| Ex. 6 | 0.01 | 0.01 |
| Ex. 7 | 0.008 | 0.008 |
| Comp. Ex. 2 | 0.005 | 0.01 |
| Comp. Ex. 3 | 0.01 | 0.02 |
| Comp. Ex. 4 | 0.01 | 0.03 |

As shown in Table 1 above, in each of the transparent gas barrier films obtained in Examples 1 to 4, the water vapor transmission rates before and after the bending test were not more than 0.007 g·m⁻²·day⁻¹. From these results, it was found that they all exhibited favorable gas barrier properties. In each of the transparent gas barrier films obtained in Examples 1, 2, and 4, the ratio (Y/X) of a maximum density value (Y) to a minimum density value (X) in the transparent gas barrier layer was 1.1 or more. In these films, no change in water vapor transmission rate was observed before and after the bending test. Thus, they also exhibited favorable bending resistance. In contrast, in the transparent gas barrier film obtained in Comparative Example 1, while the water vapor transmission rate before the bending test was 0.005 g·m⁻²·day⁻¹ and thus was favorable, the water vapor transmission rate after the bending test was 0.010 g·m⁻²·day⁻¹, which shows the deterioration in gas barrier properties. The reason for this is considered to be that, in Comparative Example 1, difference in internal stress was caused among the layers so that cracks were formed, resulting in deterioration in gas barrier properties.

As shown in Table 2 above, the transparent gas barrier films obtained in Examples 5 to 7 exhibited excellent gas barrier properties. Also, in these transparent gas barrier films, no change in water vapor transmission rate was observed before and after the bending test, which shows that they also exhibited favorable bending resistance. In contrast, in each of the transparent gas barrier films obtained in Comparative Examples 2 to 4, the water vapor transmission rate after the bending test was larger than the water vapor transmission rate before the bending test, which shows the deterioration in gas barrier properties. The reason for this is considered to be that, in Comparative Examples 2 to 4, difference in internal stress was caused among the layers so that cracks were formed, resulting in deterioration in gas barrier properties.

INDUSTRIAL APPLICABILITY

The transparent gas barrier film according to the present invention exhibits excellent gas barrier properties and includes a transparent gas barrier layer having a very low internal stress. The transparent gas barrier film according to the present invention can be used as, for example, a flexible substrate or a sealing material of various display devices (display) such as organic EL displays, field emission displays, and liquid crystal displays; solar batteries: thin film batteries; and various electric elements and electronic elements, such as electric double layer capacitors. There is no limitation on the use of the transparent gas barrier film, and the transparent gas barrier film is applicable to a wide range of fields, in addition to the above described uses.

EXPLANATION OF REFERENCE NUMERALS

100: transparent gas barrier film
110: resin substrate
120: transparent gas barrier layer
500: production apparatus 1: vacuum chamber
2: pressure gradient type plasma gun
   (arc discharge plasma-generating source)
3: resin substrate
4: plasma beam
5: reflecting electrode
6: converging electrode
7: vapor deposition source
8: vapor deposition material
9: electron beam
10: quartz monitor
11: discharge gas supply unit
12: reactant gas supply unit
13: substrate roll
20: vacuum pump
21: gas cylinder for discharge gas
22: gas cylinder for reactant gas

The invention claimed is:

1. A method for producing a transparent gas barrier film, comprising the step of
   forming a transparent gas barrier layer by generating arc discharge plasma and vapor-depositing at least one of a metal oxide and a metalloid oxide over a resin substrate in the presence of a reactant gas,
   wherein, the forming step comprises the substeps of shortening the distance between the transparent gas barrier layer and the plasma source and increasing the distance between the transparent gas barrier layer and the plasma source, in either order, repeating the substeps of shortening the distance and increasing the distance once, and
   wherein the transparent gas barrier layer obtained from the forming step comprises a plurality of layers each having a density that changes continuously in the thickness direction, and the change in density is from high density to low density or from low density to high density and then cycles alternatively from low density to high density or high density to low density, respectively, one or more times.

2. The method for producing a transparent gas barrier film of claim 1, wherein the substeps of shortening the distance and increasing the distance are repeated twice.

3. The method for producing a transparent gas barrier film of claim 1, wherein the substeps of shortening the distance and increasing the distance are repeated more than twice.

4. The method for producing a transparent gas barrier film of claim 1, wherein the change in density is linear.

5. The method for producing a transparent gas barrier film of claim 1, wherein the change in density is curvilinear.

6. The method for producing a transparent gas barrier film of claim 1, wherein the transparent gas barrier layer has a $D_{max}/D_{min}$ ratio of 1.1 or more.

7. The method for producing a transparent gas barrier film of claim 1, wherein the metal oxide is vapor-deposited over the resin substrate.

8. The method for producing a transparent gas barrier film of claim 1, wherein the metalloid oxide is vapor-deposited over the resin substrate.

* * * * *